(12) United States Patent
Kang et al.

(10) Patent No.: US 9,035,433 B2
(45) Date of Patent: May 19, 2015

(54) ORGANIC LIGHT EMITTING DEVICE

(71) Applicant: LG Display Co., Ltd., Seoul (KR)

(72) Inventors: Jin Goo Kang, Paju-si (KR); Young Hoon Shin, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/097,041

(22) Filed: Dec. 4, 2013

(65) Prior Publication Data

US 2014/0183474 A1    Jul. 3, 2014

(30) Foreign Application Priority Data

Dec. 28, 2012 (KR) .................. 10-2012-0157082

(51) Int. Cl.
*H01L 27/32* (2006.01)
*H01L 29/51* (2006.01)
*H01L 51/52* (2006.01)

(52) U.S. Cl.
CPC ......... *H01L 51/5253* (2013.01); *H01L 27/3244* (2013.01)

(58) Field of Classification Search
CPC . H01L 2251/50; H01L 2227/32; H01L 27/32; H01L 27/3225; H01L 27/3227; H01L 27/3232; H01L 27/3234; H01L 27/3244; H01L 27/3246; H01L 27/3248; H01L 27/3274; H01L 29/51; H01L 29/518; H01L 29/786
USPC .................. 257/632, 635, 637, 639, 640, 649
See application file for complete search history.

(56) References Cited

U.S. PATENT DOCUMENTS

| | | | | |
|---|---|---|---|---|
| 8,415,667 | B2* | 4/2013 | Yamazaki et al. | 257/59 |
| 8,791,456 | B2* | 7/2014 | Yamazaki et al. | 257/43 |
| 8,803,149 | B2* | 8/2014 | Sakata | 257/59 |

* cited by examiner

*Primary Examiner* — Mamadou Diallo
*Assistant Examiner* — Joannie A Garcia
(74) *Attorney, Agent, or Firm* — Fenwick & West LLP

(57) ABSTRACT

An organic light emitting device comprises a first substrate; a thin film transistor layer provided on the first substrate; a light emitting diode layer provided on the thin film transistor layer; and a passivation layer provided on the light emitting diode layer, the passivation layer including a first inorganic insulating film and a second inorganic insulating film, wherein a content of H contained in the first inorganic insulating film is smaller than that of H contained in the second inorganic insulating film.

10 Claims, 3 Drawing Sheets

(a)

(b)

(c)

ORGANIC LIGHT EMITTING DEVICE

CROSS REFERENCE TO RELATED APPLICATIONS

This application claims the benefit of the Korean Patent Application No. 10-2012-0157082 filed on Dec. 28, 2012, which is hereby incorporated by reference for all purposes as if fully set forth herein.

BACKGROUND OF THE INVENTION

1. Field of the Invention

The present invention relates to an organic light emitting device, and more particularly, to a passivation layer of an organic light emitting device.

2. Discussion of the Related Art

Although a liquid crystal display device has been widely used as a flat panel display device, the liquid crystal display device requires a backlight as a separate light source and has technical limitations in view of brightness and contrast ratio. In this respect, attention to an organic light emitting device which is relatively excellent in brightness and contrast ratio has been increased.

The organic light emitting device has a structure in which a light emitting layer is interposed between a cathode and an anode, wherein electrons are generated in the cathode, and holes are generated in the anode. If the electrons generated in the cathode and the holes generated in the anode are injected into the light emitting layer, excitons are generated by combination of the injected electrons and holes, and then the generated excitons are changed from the excited state to a ground state, whereby light is emitted. In this way, the organic light emitting device displays a picture image.

Hereinafter, an organic light emitting device according to the related art will be described with reference to the accompanying drawing.

FIG. 1 is a brief cross-sectional view illustrating an organic light emitting device according to the related art.

As shown in FIG. 1, the organic light emitting device of the related art includes a first substrate 10, a light emitting device layer 20, a passivation layer 30, an adhesive layer 40, and a second substrate 50.

The light emitting device layer 20 is formed on the first substrate 10. The light emitting device layer 20 includes a thin film transistor layer 21 formed on the first substrate 10 and a light emitting diode layer 22 formed on the thin film transistor layer 21.

The passivation layer 30 is formed on the light emitting device layer 20. The passivation layer 30 serves to prevent water from being permeated into the light emitting device layer 20. This passivation layer 30 includes an inorganic insulating film such as SiNx.

The adhesive layer 40 is formed on the passivation layer 30. The adhesive layer 40 serves to adhere the second substrate 50 onto the passivation layer 30.

The second substrate 50 is formed on the adhesive layer 40, and serves to protect the organic light emitting device from external impact.

The aforementioned organic light emitting device of the related art has problems as follows.

The inorganic insulating film such as SiNx used as the passivation layer 30 may be deposited by plasma enhanced chemical vapor deposition (PECVD) or sputtering. If the inorganic insulating film is deposited using the sputtering method, the organic light emitting layer constituting the light emitting diode layer 22 may be damaged. Accordingly, the inorganic insulating film is mainly deposited using the PECVD method.

Also, if the inorganic insulating film is deposited using the PECVD method, the deposition process should be performed at a temperature less than a glass transition temperature Tg of the organic light emitting layer. Accordingly, the deposition process is performed for the inorganic insulating film at a temperature of 100° C. or less. Meanwhile, the inorganic insulating film obtained through such a deposition process contains a lot of hydrogen (H) decomposed from source gases such as $SiH_4$ and $NH_3$.

As described above, according to the light emitting device of the related art, the passivation layer 30 contains a lot of H. If the passivation layer 30 contains a lot of H, H moves downwardly as time passes, and thus H may become diffused into an active layer of the thin film transistor layer 21. In this way, if H is diffused into the active layer, H oxidizes a semiconductor constituting the active layer, and consequently a threshold voltage of the thin film transistor is changed. As a result, a problem occurs in that picture quality which is displayed is deteriorated.

SUMMARY OF THE INVENTION

Accordingly, the present invention is directed to an organic light emitting device that substantially obviates one or more problems due to limitations and disadvantages of the related art.

An advantage of the present invention is to provide an organic light emitting device that reduces the content of H contained in a passivation layer to minimize the amount of H diffused into an active layer of a thin film transistor, thereby improving picture quality.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light emitting device according to one embodiment of the present invention comprises a first substrate; a thin film transistor layer provided on the first substrate; a light emitting diode layer provided on the thin film transistor layer; and a passivation layer provided on the light emitting diode layer, the passivation layer including a first inorganic insulating film and a second inorganic insulating film, wherein a content of H contained in the first inorganic insulating film is smaller than that of H contained in the second inorganic insulating film.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

The terminology "on" disclosed in this specification means that an element is formed directly on another element and moreover still another element may be interposed between these elements.

Hereinafter, the preferred embodiment of the present invention will be described in detail with reference to the accompanying drawings.

Figure 1:
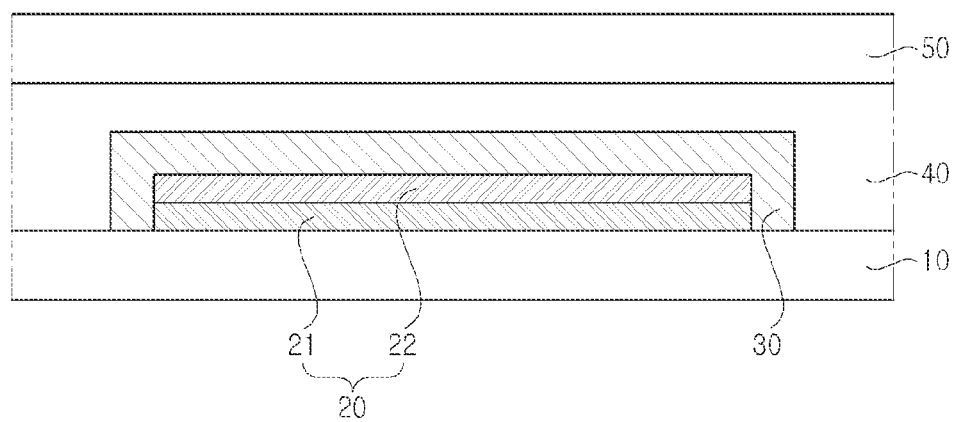
FIG. 1 is a brief cross-sectional view illustrating an organic light emitting device according to the related art.
Figure 2:
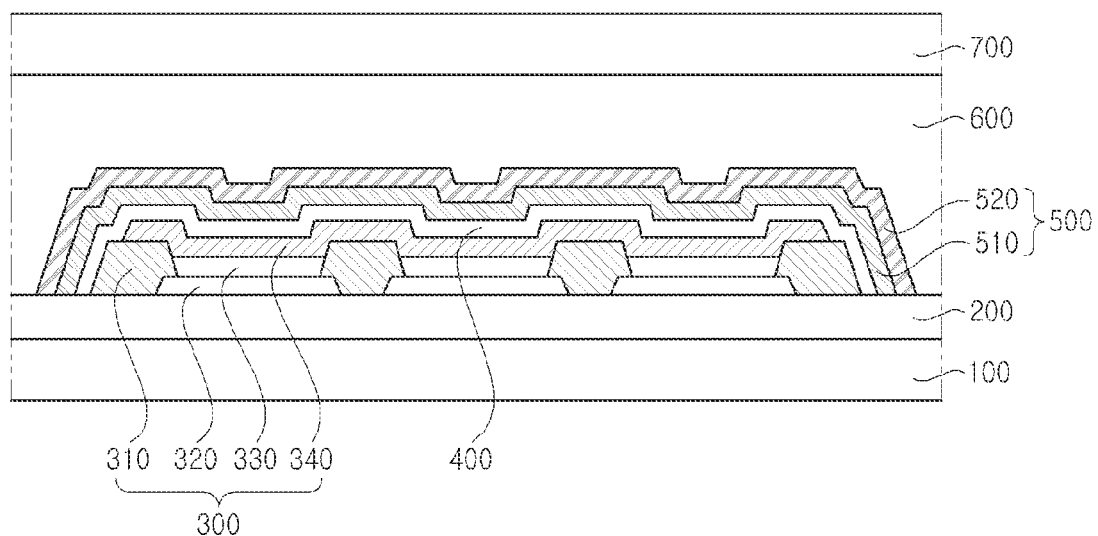
FIG. 2 is a brief cross-sectional view illustrating an organic light emitting device according to one embodiment of the present invention.

FIG. 2 is a brief cross-sectional view illustrating an organic light emitting device according to one embodiment of the present invention.

As shown in FIG. 2, the organic light emitting device according to one embodiment of the present invention includes a first substrate 100, a thin film transistor layer 200, a light emitting diode layer 300, a capping layer 400, a passivation layer 500, an adhesive layer 600, and a second substrate 700.

Although glass is mainly used as the first substrate 100, a transparent plastic that may be bent, for example, polyimide, may be used as the first substrate 100. If polyimide is used as a material of the first substrate 100, considering that a deposition process of high temperature is performed on the first substrate 100, polyimide having excellent heat-resistance, which may be endured at high temperature, may be used.

The thin film transistor layer 200 is provided on the first substrate 100. The thin film transistor layer 200 includes a plurality of lines, such as gate lines, data lines and power lines, a switching thin film transistor, and a driving thin film transistor, wherein the plurality of lines are connected with the switching thin film transistor and the driving thin film transistor. Also, a capacitor may be formed by combination of the lines and electrodes of the thin film transistor. The details of the thin film transistor layer 200 will be described later with reference to FIG. 4.

The light emitting diode layer 300 is provided on the thin film transistor layer 200.

The light emitting diode layer 300 includes a bank layer 310, a first electrode 320, a light emitting portion 330, and a second electrode 340.

The bank layer 310 is patterned on the thin film transistor layer 200. In more detail, the bank layer 310 is formed in a region except for a light emitting region. The light emitting region is defined by the bank layer 310. The bank layer 310 includes, but is not limited to, an organic insulating material, for example, polyimide, photo acryl, or BCB.

The first electrode 320 is patterned on the thin film transistor layer 200. The first electrode 320 is electrically connected with a drain electrode formed within the thin film transistor layer 200. If the present invention is applied in accordance with a bottom emission method, the first electrode 320 comprises a transparent conductive material. If the present invention is applied in accordance with a top emission method, the first electrode 320 comprises an opaque conductive material which is favorable to reflection.

The light emitting portion 330 is formed on the first electrode 320. Although not shown, the light emitting portion 330 may be formed by a structure in which a hole injecting layer, a hole transporting layer, an organic light emitting layer, an electron transporting layer and an electron injecting layer are deposited in due order. One layer or two or more layers of the hole injecting layer, the hole transporting layer, the electron transporting layer and the electron injecting layer may be omitted. The organic light emitting layer may be formed to emit light of the same color per pixel, for example, white light, or may be formed to emit light of different colors per pixel, for example, red, green or blue light.

The second electrode 340 is formed on the light emitting portion 330. The second electrode 340 may be formed in the form of an electrode common to all of the pixels without being classified per pixel. In other words, the second electrode 340 may be formed on the bank layer 310 as well as the light emitting portion 330. If the present invention is applied in accordance with the bottom emission method, the second electrode 340 comprises an opaque conductive material favorable to reflection. If the present invention is applied in accordance with the top emission method, the second electrode 340 comprises a transparent conductive material.

The capping layer 400 is provided on the light emitting diode layer 300. The capping layer 400 serves to increase a light extraction effect. The capping layer 400 may be made of the aforementioned material constituting the light emitting portion 330. For example, the capping layer 400 may be made of the material constituting the hole transporting layer or the hole injecting layer, or a host material constituting the organic light emitting layer. However, the capping layer 400 may be omitted.

The passivation layer 500 is provided on the capping layer 400. The passivation layer 500 is formed to cover an upper portion and a side portion of the light emitting diode layer 300, thereby protecting the light emitting diode layer 300 and preventing external water from being permeated into the light emitting diode layer 300.

The passivation layer 500 includes a first inorganic insulating film 510 and a second inorganic insulating film 520. The first inorganic insulating film 510 is provided on the capping layer 400, and the second inorganic insulating film 520 is provided on the first inorganic insulating film 510.

Each of the first inorganic insulating film 510 and the second inorganic insulating film 520 may include, but is not limited to, SiNx, SiOx, SiON or AlOx.

Although the first inorganic insulating film 510 and the second inorganic insulating film 520 may be made of the same material, they may also be made of materials different from each other. If the first inorganic insulating film 510 and the second inorganic insulating film 520 are made of the same material, they may be deposited by a continuous process by changing a process condition at the same deposition chamber.

In this specification, if any one inorganic insulating film is made of the same material as that of another inorganic insulating film, it means that basic compound structures of the materials constituting the two inorganic insulating films are the same as each other as well as means that compositions of the materials constituting the two inorganic insulating films are the same as each other. For example, if the first organic insulating film 510 and the second inorganic insulating film 520 are made of a SiNx structure, they are made of the same material.

According to the present invention, the content of H contained in the first inorganic insulating film 510 is smaller than that of H contained in the second inorganic insulating film 520.

In more detail, it is preferable that the content of H contained in the first inorganic insulating film 510 is more than 10% and less than 30%. It is also preferable that the content of H contained in the second inorganic insulating film 520 is more than 30% and less than 40%.

In this specification, 'the content of H' means a ratio of a compound that contains H in the inorganic insulating film to a compound that does not contain H in the inorganic insulating film.

For example, if the first inorganic insulating film 510 or the second inorganic insulating film 520 contains SiNx deposited by PECVD using $SiH_4$, $NH_3$ and $N_2$ as source gases, the first inorganic insulating film 510 or the second inorganic insulating film 520 may additionally contain a compound such as Si:H and N:H in addition to SiNx. At this time, a ratio of Si:H and/or N:H to SiNx in the first inorganic insulating film 510 or the second inorganic insulating film 520 becomes 'the content of H'.

The content of H may be measured by Fourier Transform Infrared (FT-IR) spectroscopy. Accordingly, in this specification, the content of H is the value measured by the FT-IR spectroscopy.

Consequently, in the case that the first inorganic insulating film 510 or the second inorganic insulating film 520 contains SiNx, Si:H and N:H, if the content of H contained in the first inorganic insulating film 510 is 10% and the content of H contained in the second inorganic insulating film 520 is 30%, it means that the content of Si:H and N:H measured by the FT-IR spectroscopy is 10% in the first inorganic insulating film 510, and the content of Si:H and N:H measured by the FT-IR spectroscopy is 30% in the second inorganic insulating film 520.

As described above, according to the present invention, since the passivation layer 500 includes the first inorganic insulating film 510 whose content of H is relatively smaller than that of the second inorganic insulating film 520, preferably the first inorganic insulating film 510 whose content of H is more than 10% and less than 30%, the content of H diffused into the active layer of the thin film transistor layer 200 is reduced as compared with the related art, thus reducing the variation of the threshold voltage of the thin film transistor. As a result, picture quality may be improved as compared with the related art.

The content of H of the first inorganic insulating film 510 and the content of H of the second inorganic insulating film 520 may be adjusted by changing a composition ratio of the source gases and the deposition process condition. For example, in the case that the same types of source gases are used, the composition ratio of the source gas, which contains H, among the source gases, may be reduced to obtain the first inorganic insulating film 510 whose content of H is relatively small, and the composition ratio of the source gas, which contains H, may be increased to obtain the second inorganic insulating film 520 whose content of H is relatively large.

Also, in the case that the deposition process is performed at a temperature less than the glass transition temperature Tg of the organic light emitting layer in the light emitting portion 330, if the deposition temperature is increased within the temperature range of the glass transition temperature Tg or less, the content of H evaporated as a gas may be increased to obtain the first inorganic insulating film 510 whose content of H is relatively small. If the deposition temperature is reduced within the temperature range of the glass transition temperature Tg or less, the second inorganic insulating film 520 whose content of H is relatively large may be obtained.

As described above, it is preferable that the content of H contained in the first inorganic insulating film 510 is more than 10% and less than 30%. This is because it is difficult to control the process if the content of H is less than 10% and it is not possible to expect improvement of picture quality as the content of H in the passivation layer 500 is increased if the content of H is more than 30%.

Also, it is preferable that the content of H contained in the second inorganic insulating film 520 is more than 30% and less than 40%. This is because that the water permeation prevention function which is the main function of the passivation layer 500 may be deteriorated if the content of H is less than 30% and it is not possible to expect improvement of picture quality as the content of H in the passivation layer 500 is increased if the content of H is more than 40%.

As a result, in order to solve the problem that picture quality is deteriorated as H contained in the passivation layer 500 is diffused into the active layer of the thin film transistor layer 200, it is preferable to reduce the content of H contained in the passivation layer 500. However, since the water permeation prevention function which is the main function of the passivation layer 500 may be deteriorated if the content of H contained in the passivation layer 500 is reduced, there is a limitation in reducing the content of H contained in the passivation layer 500.

Accordingly, in the present invention, the passivation layer 500 is formed by combination of the first inorganic insulating film whose content of H is relatively small and the second inorganic insulating film whose content of H is relatively great, thus minimizing the problem that picture quality is deteriorated by H diffused into the active layer and allowing the second inorganic insulating film 520 to desirably perform the water permeation prevention function.

The first inorganic insulating film 510 and the second inorganic insulating film 520 are formed at their proper thickness to perform the aforementioned functions. Particularly, it is preferable that the ratio of the thickness of the first inorganic insulating film 510 to the thickness of the second inorganic insulating film 520 is in the range of 2:8 to 8:2. If the thickness of the first inorganic insulating film 510 to the thickness of the second inorganic insulating film 520 departs from the above thickness range, the problem that picture quality is deteriorated by H diffused into the active layer cannot be solved, or the water permeation prevention function may be deteriorated.

The passivation layer 500, which includes the first inorganic insulating film 510 and the second inorganic insulating film 520, may be varied in various manners, as described below in detail with reference to FIGS. 3a to 3c.

Figure 3:
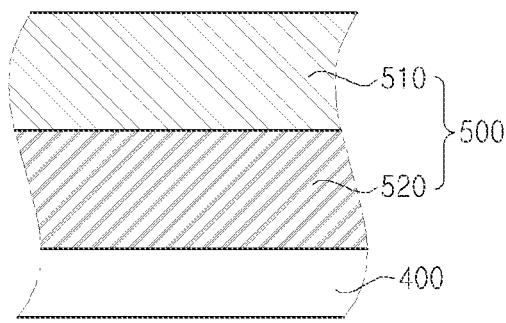
FIGS. 3a to 3c are cross-sectional views illustrating a passivation layer according various embodiments of the present invention.
Figure 3:
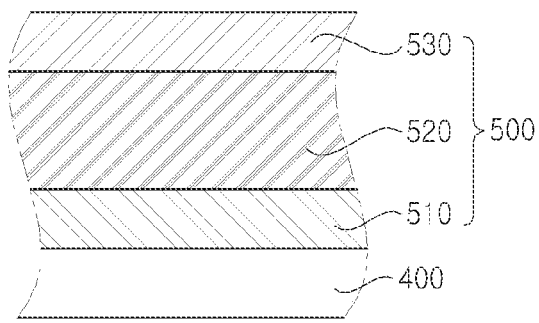
Figure 3:
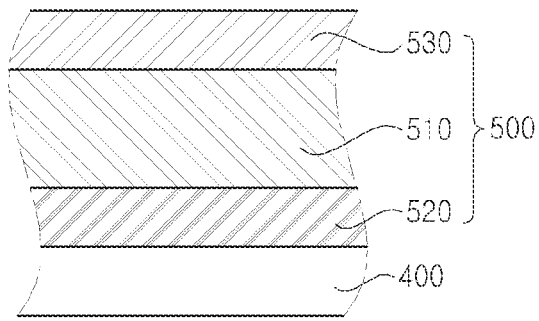

FIGS. 3a to 3c are cross-sectional views illustrating a passivation layer according various embodiments of the present invention.

Referring to FIG. 3a, the passivation layer 500 according to another embodiment of the present invention includes the second inorganic insulating film 520 formed on the capping layer 400 and the first inorganic insulating film 510 formed on the second inorganic insulating film 520.

The first inorganic insulating film 510 is first formed on the capping layer 400 in FIG. 2, whereas the second inorganic insulating film 520 is first formed on the capping layer 400 in FIG. 3a.

Referring to FIGS. 3b and 3c, the passivation layer 500 according to still another embodiment of the present invention further includes a third inorganic insulating film 530 formed on the first inorganic insulating film 510 or the second inorganic insulating film 520.

Referring to FIG. 3b, the first inorganic insulating film 510, the second inorganic insulating film 520, and the third inorganic insulating film 530 are formed on the capping layer 400 in due order. The third inorganic insulating film 530 formed on the second inorganic insulating film 520 has a content of H that is smaller than that of the second inorganic insulating film 520.

The third inorganic insulating film 530 whose content of H is smaller than that of the second inorganic insulating film 520 has a content of H more than 10% and less than 30% in the same manner as the first inorganic insulating film 510. Particularly, the third inorganic insulating film 530 may have, but is not limited to, having the content of H the same as that of the first inorganic insulating film 510. Also, the third inorganic insulating film 530 whose content of H is smaller than that of the second inorganic insulating film 520 may have, but is not limited to, being of the same material as that of the first inorganic insulating film 510.

In FIG. 3b, it is preferable that the ratio of the sum of the thickness of the first inorganic insulating film 510 and the thickness of the third inorganic insulating film 530 to the thickness of the second inorganic insulating film 520 is in the range of 2:8 to 8:2.

Referring to FIG. 3c, the second inorganic insulating film 520, the first inorganic insulating film 510, and the third inorganic insulating film 530 are formed on the capping layer 400 in due order. The third inorganic insulating film 530 formed on the first inorganic insulating film 510 has a content of H greater than that of the first inorganic insulating film 510.

The third inorganic insulating film 530 whose content of H is greater than that of the first inorganic insulating film 510 has the content of H more than 30% and less than 40% in the same manner as the second inorganic insulating film 520. Particularly, the third inorganic insulating film 530 may have, but is not limited to, having the content of H the same as that of the second inorganic insulating film 520. Also, the third inorganic insulating film 530 whose content of H is greater than that of the first inorganic insulating film 510 may have, but is not limited to, being of the same material as that of the second inorganic insulating film 520.

In FIG. 3c, it is preferable that the ratio of the thickness of the first inorganic insulating film 510 to the sum of the thickness of the second inorganic insulating film 520 and the thickness of the third inorganic insulating film 530 is in the range of 2:8 to 8:2.

Also, although not shown, a fourth inorganic insulating film may further be formed on the third inorganic insulating film 530 in FIG. 3b. In this case, the fourth inorganic insulating film has the content of H more than 30% and less than 40%. Also, in FIG. 3c, the fourth inorganic insulating film may further be formed on the third inorganic insulating film 530 in FIG. 3c. In this case, the fourth inorganic insulating film has the content of H more than 10% and less than 30%.

Finally, the passivation layer 500 may be made of the inorganic insulating films of three layers, four layers, five layers, or more. At this time, the inorganic insulating film whose content of H is relatively large and the inorganic insulating film whose content of H is relatively small are formed alternately. Also, it is preferable that the ratio of the sum of the thicknesses of the inorganic insulating films having the relatively large content of H on the basis of the content of H of 30% to the sum of the thicknesses of the inorganic insulating films having the relatively small content of H on the basis of the content of H of 30% is in the range of 2:8 to 8:2.

Referring to FIG. 2 again, the adhesive layer 600 is provided between the passivation layer 500 and the second substrate 700 to adhere the second substrate 700 onto the passivation layer 500.

An adhesive film may be used as the adhesive layer 600, or a liquid adhesive material may be hardened to form the adhesive layer 600.

The second substrate 700 may be formed of, but is not limited to, a reinforcing glass to protect the light emitting device from external physical impacts or scratches. A transparent plastic that may be bent, for example, polyimide, may be used as the second substrate 700.

Figure 4:
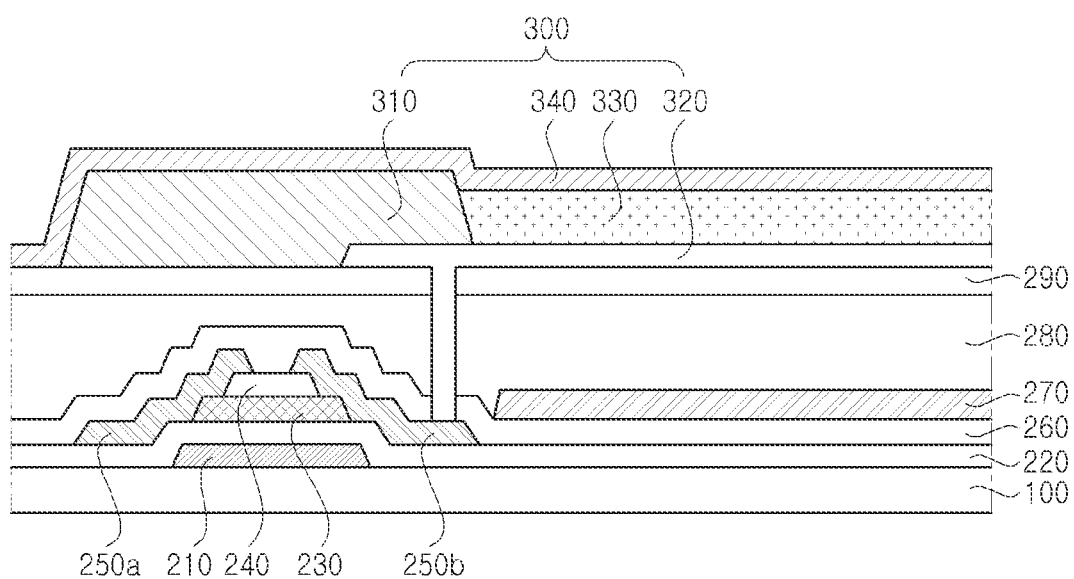
FIG. 4 is a detailed cross-sectional view illustrating a thin film transistor layer of an organic light emitting device according to one embodiment of the present invention.

FIG. 4 is a detailed cross-sectional view illustrating a thin film transistor layer of an organic light emitting device according to one embodiment of the present invention. The same reference numbers will be used throughout the drawings to refer to the same or like parts as those of the aforementioned embodiments, and the repeated description for the same elements will be omitted.

As shown in FIG. 4, the light emitting device according to one embodiment of the present invention includes a first substrate 100, a gate electrode 210, a gate insulating film 220, an active layer 230, an etch stopper 240, a source electrode 250a, a drain electrode 250b, a first protecting film 260, a color filter 270, a planarization layer 280, a second protecting film 290, and a light emitting diode layer 300.

The gate electrode 210 is patterned on the first substrate 100. The gate electrode 120 may include Mo, Al, Cr, Au, Ti, Ni, Nd, Cu, or their alloys, and may be made of a single layer of the above metal or alloy, or multiple layers of two or more metals or alloys.

The gate insulating film 220 is formed on the gate electrode 210 to insulate the gate electrode 210 from the active layer 230. The gate insulating film 220 may be made of, but is not limited to, an inorganic based insulating material such as silicon oxide or silicon nitride. The gate insulating film 220 may be made of an organic based material such as photo acryl or BCB.

The active layer 230 is patterned on the gate insulating film 220. The active layer 230 may be made of, but is not limited to, an oxide semiconductor such as In—Ga—Zn—O (IGZO). The active layer 230 may be made of a silicon based semiconductor.

The etch stopper 240 is patterned on the active layer 230. The etch stopper 240 serves to prevent a channel region of the active layer 230 from being etched during an etching process for patterning the source electrode 250a and the drain electrode 250b. The etch stopper 240 may be made of, but is not limited to, an inorganic insulating material such as silicon oxide or silicon nitride. The etch stopper 240 may be omitted.

The source electrode 250a and the drain electrode 250b are patterned on the etch stopper 240 while facing each other. The source electrode 250a is extended towards one direction of the active layer 230 from the etch stopper 240 and connected with the active layer 230. The drain electrode 250b is extended towards the other direction of the active layer 230 from the etch stopper 240 and connected with the active layer 230. The source electrode 250a and the drain electrode 250b may include Mo, Al, Cr, Au, Ti, Ni, Nd, Cu, or their alloy, and may be made of a single layer of the above metal or alloy, or multiple layers of two or more metals or alloys.

The first protecting film 260 is formed on the source electrode 250a and the drain electrode 250b. The first protecting film 260 may be made of, but is not limited to, an inorganic insulating material such as silicon oxide or silicon nitride.

The color filter 270 is formed on the first protecting film 260. The color filter 270 is formed to overlap the light emitting diode layer 300 of the light emitting diode layer 300, whereby the light emitted from the light emitting portion 330 may be emitted towards the first substrate 100 by passing through the color filter 270. This color filter 270 may be made of a red color filter, a green color filter and a blue color filter, which are formed respectively per pixel. However, if the light emitting portion 330 emits light of red, green or blue per pixel, the color filter 270 may be omitted.

The planarization layer 280 is formed on the color filter 270 to reduce the surface step difference of the light emitting device. The planarization layer 280 may be made of, but is not limited to, an organic insulating material such as photo acryl or BCB.

The second protecting film 290 is formed on the planarization layer 280. The second protecting film 290 may be made of, but is not limited to, an inorganic insulating material such as silicon oxide or silicon nitride. The second protecting film 290 may be omitted.

The light emitting diode layer 300 includes a bank layer 310, a first electrode 320, a light emitting portion 330 and a second electrode 340 as described above.

The bank layer 310 and the first electrode 320 are formed on the second protecting film 290.

The first electrode 320 is connected with the drain electrode 250b. In other words, since a contact hole is formed at a predetermined region of the first protecting film 260, the planarization layer 280 and the second protecting film 290, the drain electrode 250b is exposed by the contact hole, and the first electrode 320 is connected with the drain electrode 250b through the contact hole.

The light emitting portion 330 is formed on the first electrode 320, and the second electrode 340 is formed on the light emitting portion 330.

The thin film transistor layer 200 and the light emitting diode layer 300, which are shown in FIG. 4, are formed in accordance with one embodiment of the present invention. The thin film transistor layer 200 and the light emitting diode layer 300 according to the present invention are not limited to FIG. 4, and various modifications known in the art may be made in the thin film transistor 200 and the light emitting diode layer 300.

For example, FIG. 4 relates to the thin film transistor of a bottom gate structure in which the gate electrode 210 is formed below the active layer 230. The present invention also includes a thin film transistor of a top gate structure in which the gate electrode 210 is formed on the active layer 230.

As described above, the advantages of present invention may be obtained as follows.

According to the present invention, since the passivation layer includes the first inorganic insulating film whose content of H is relatively small, the content of H diffused into the active layer of the thin film transistor layer is reduced as compared with the related art, thus reducing the variation of the threshold voltage of the thin film transistor. As a result, picture quality may be improved as compared with the related art.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting device comprising:
    a first substrate;
    a thin film transistor layer provided on the first substrate;
    a light emitting diode layer provided on the thin film transistor layer; and
    a passivation layer provided on the light emitting diode layer, the passivation layer including a first inorganic insulating film and a second inorganic insulating film,
    wherein the first and the second inorganic insulating films enclose the light emitting diode layer with respect to the first substrate, and
    wherein a content of H contained in the first inorganic insulating film is smaller than that of H contained in the second inorganic insulating film.

2. The organic light emitting device of claim 1, wherein the content of H contained in the first inorganic insulating film is more than 10% and less than 30%.

3. The organic light emitting device of claim 1, wherein the content of H contained in the second inorganic insulating film is more than 30% and less than 40%.

4. The organic light emitting device of claim 1, wherein each of the first inorganic insulating film and the second inorganic insulating film includes SiNx, SiOx, SiON, or AlOx.

5. The organic light emitting device of claim 1, wherein the first inorganic insulating film and the second inorganic insulating film are made of the same material as each other.

6. The organic light emitting device of claim 1, wherein a ratio of a thickness of the first inorganic insulating film to a thickness of the second inorganic insulating film is in the range of 2:8 to 8:2.

7. The organic light emitting device of claim 1, wherein the first inorganic insulating film is provided on the light emitting diode layer, and the second inorganic insulating film is provided on the first inorganic insulating film.

8. The organic light emitting device of claim 7, wherein a third inorganic insulating film is further provided on the second inorganic insulating film, and a content of H contained in the third inorganic insulating film is more than 10% and less than 30%.

9. The organic light emitting device of claim 1, wherein the second inorganic insulating film is provided on the light emitting diode layer, and the first inorganic insulating film is provided on the second inorganic insulating film.

10. The organic light emitting device of claim 9, wherein a third inorganic insulating film is further provided on the first inorganic insulating film, and a content of H contained in the third inorganic insulating film is more than 30% and less than 40%.

* * * * *